United States Patent [19]

Nagahama

[11] Patent Number: 5,679,999
[45] Date of Patent: Oct. 21, 1997

[54] PIEZOELECTRIC VIBRATOR HAVING U-SHAPED SUPPORTS

[75] Inventor: Shouhei Nagahama, Tokyo, Japan

[73] Assignee: NEC Corporation, Tokyo, Japan

[21] Appl. No.: 575,171

[22] Filed: Dec. 19, 1995

[30] Foreign Application Priority Data

Dec. 20, 1994 [JP] Japan ................... 6-316837

[51] Int. Cl.⁶ ................................................ H01L 41/08
[52] U.S. Cl. .................................. 310/351; 310/353
[58] Field of Search ........................... 310/344, 348, 310/351–353

[56] References Cited

U.S. PATENT DOCUMENTS

| | | | |
|---|---|---|---|
| 2,228,601 | 1/1941 | Hawk | 310/353 |
| 3,849,681 | 11/1974 | Scott, Jr. et al. | 310/351 |
| 4,160,928 | 7/1979 | Nakayama et al. | 310/353 |
| 4,234,811 | 11/1980 | Hishida | 310/348 |
| 4,267,479 | 5/1981 | Kato | 310/348 |

*Primary Examiner*—Mark O. Budd
*Attorney, Agent, or Firm*—Whitham, Curtis, Whitham & McGinn

[57] ABSTRACT

A piezoelectric vibrator includes a piezoelectric plate having electrodes respectively provided on a top and a bottom, and leads each extending from the respective electrode. A plurality of supports fix an edge portion of the piezoelectric plate including the leads by a conductive adhesive, and a base formed of an insulator, supports the plurality of supports. The plurality of supports each include a lower portion for sustaining the piezoelectric plate and are provided with a U-shaped section. The lower portion is longer than an upper portion included in each of the plurality of supports, the upper portion for supporting the top of the piezoelectric plate.

1 Claim, 3 Drawing Sheets

PIEZOELECTRIC VIBRATOR HAVING U-SHAPED SUPPORTS

BACKGROUND OF THE INVENTION

The present invention relates to a piezoelectric vibrator using thickness slide vibration and, more particularly, to a piezoelectric vibrator capable of being easily and surely mounted to a surface mount type container.

A piezoelectric vibrator has customarily been mounted to a surface mount type container by being fixed to supports implemented as simple flat members. Specifically, a conductive adhesive is applied to recesses formed in the supports, and then one edge portion of a piezoelectric plate is inserted into the recesses. As a result, the piezoelectric plate is mechanically fixed to the supports.

However, the conventional piezoelectric vibrator has a problem that the recesses of the supports are too narrow for the conductive adhesive to be easily applied, resulting in complicated assembly. For the same reason, the adhesive cannot be uniformly applied to the supports. This not only obstructs sure electrical conduction between the plate and the supports, but also makes it impractical to guarantee mechanical strength for fixation.

Moreover, the flat supports cause the adhesive to flow down without remaining thereon. The adhesive flown down from the supports is apt to short-circuit other circuits, thereby increasing the amount of defective products.

SUMMARY OF THE INVENTION

It is therefore an object of the present invention to provide a piezoelectric vibrator which is electrically reliable, mechanically strong, and easy to produce.

A piezoelectric vibrator of the present invention has a rectangular piezoelectric plate having electrodes on the top and the bottom thereof, and leads each extending from the respective electrode. One edge portion of the piezoelectric plate including the leads is fixed to a plurality of U-shaped supports by a conductive adhesive. The supports are supported by a base formed of an insulator. Each support includes a lower portion for sustaining the piezoelectric plate and provided with a U-shaped section.

The lower portion of each support may be longer than an upper portion also included in the support and for supporting the top of the plate.

In the above configuration, the lower portion of each support and having a U-shaped section prevents the adhesive from flowing out. Hence, the adhesive retained on the supports surely fixes the plate to the supports both electrically and mechanically.

The lower portion of each support longer than the upper portion promotes easy application of the adhesive and easy insertion of the plate into the support.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENTS

Figure 1:
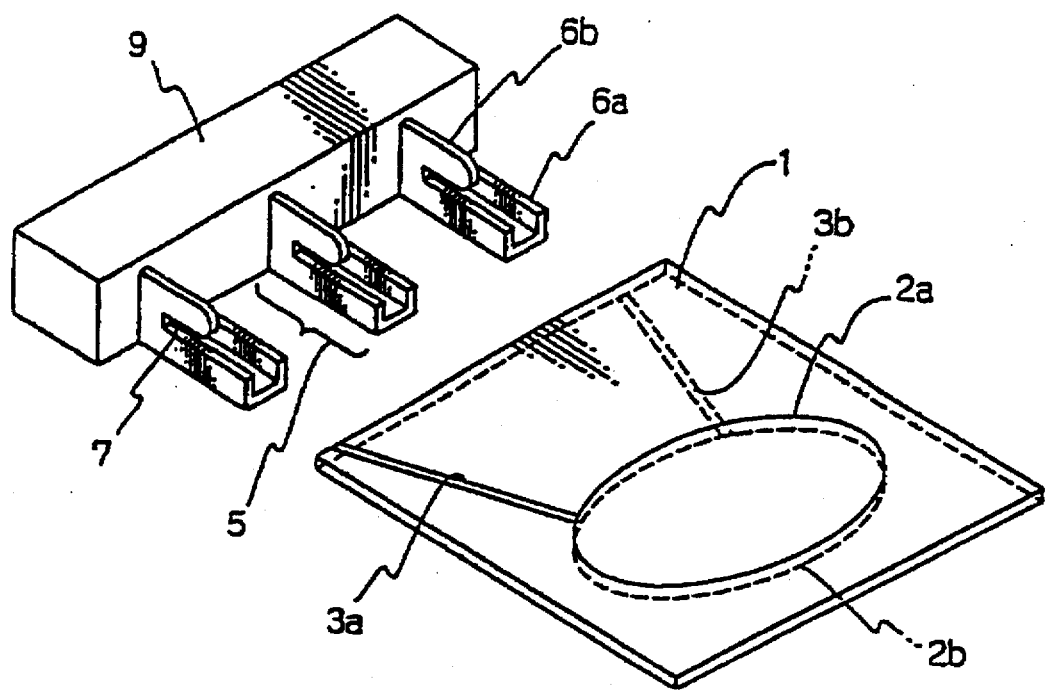
FIG. 1 is a perspective view showing a piezoelectric vibrator embodying the present invention and having supports fixed to a base.

Referring to FIG. 1 of the drawings, a piezoelectric vibrator embodying the present invention is shown and includes a plurality of supports 5 and a base 9 formed of an insulator. As shown, the supports 5 protrude horizontally from one side of the base 9 and have an identical configuration. The supports 5 are equally spaced in the lengthwise direction of the base 9. preselected ones of the supports 5 are used as terminals for electrically connecting a piezoelectric plate 1 to a power source circuit, not shown. While the base 9 is shown as having three supports 5, it may be provided with two or four or more supports, if desired.

Figures 2A, 2B:
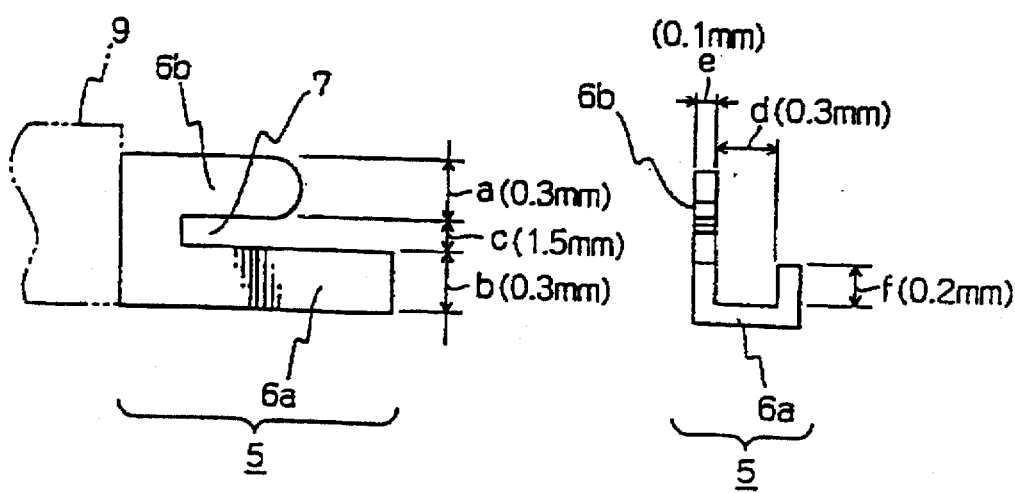
FIGS. 2A and 2B are respectively a front view and a side elevation, as viewed from the right in FIG. 1, showing one of the supports.

One of the supports 5 is shown in a front view in FIG. 2A and in a side elevation in FIG. 2B. As shown, the support 5 has a depth f in a U-shaped section. A recess 7 is formed in the support 5 and has a width c. As shown in FIG. 2A, the support 5 has a lower portion 6a and an upper portion 6b which are contiguous in the form of a letter U. The lower portion 6a and the upper portion 6b respectively support the bottom and the top of the piezoelectric plate 1. The width c of the recess 7 is great enough for the plate 1 to be easily inserted into the recess 7. The lower portion 6a is longer than the upper portion 6b.

As shown in FIG. 2B, the support 5 is implemented by a plate member and has the lower portion 6a thereof bent to have a U-shaped section. This U-shaped section has a width d and the previously mentioned depth f which are great enough to surely retain a conductive adhesive 11 (see FIG. 3) which is used to fix the plate 1. Specifically, in the illustrative embodiment, the upper portion 6b and lower portion 6a are dimensioned 0.3 mm in the vertical dimension each. The width c of the recess 7 is 0.15 mm. The support 5 has a wall thickness e of 0.1 mm, a width d of 0.3 mm, and a depth f of 0.2 mm.

Figure 3:
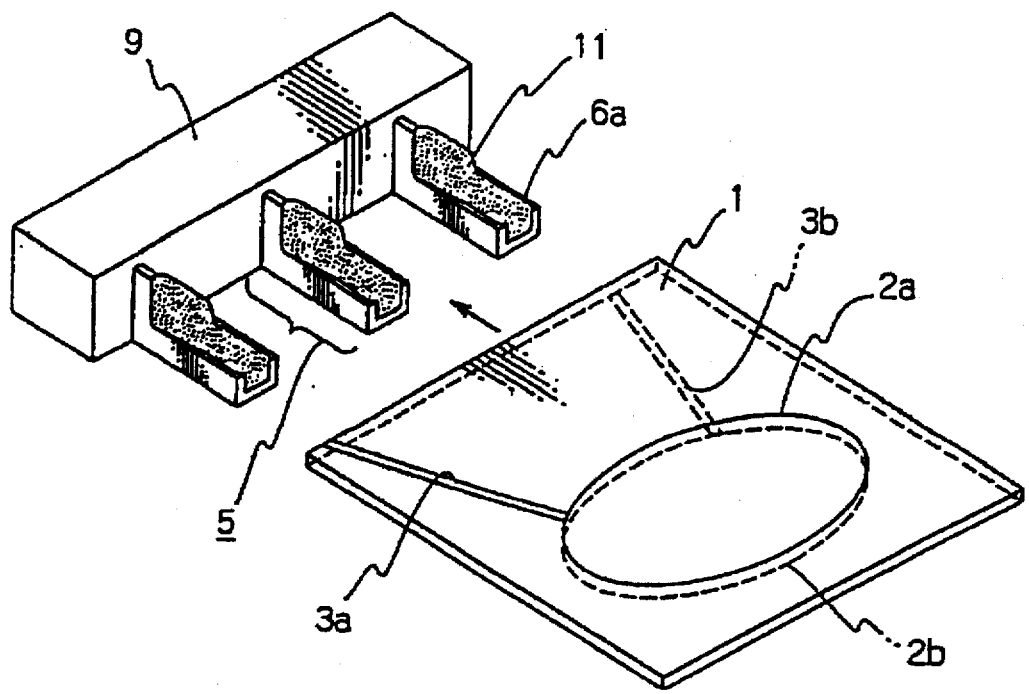
FIG. 3 is a perspective view showing a conductive adhesive applied to the supports of FIG. 1.

FIG. 3 shows the conductive adhesive 11 applied to the supports 5, and the piezoelectric plate 1 to be inserted into the recesses 7 of the supports 5. The adhesive 11 is applied also to the U-shaped sections of the upper and lower portions 6b and 6a of the supports 5 and the recesses 7 of the supports 5.

An electrode 2a is positioned at the center of the top of the plate 1 and has a predetermined area for causing thickness slide vibration to occur. A lead 3a extends from the electrode 2a to one edge of the plate 1. An electrode 2b and a lead 3b identical with the electrode 2a and lead 3a, respectively, are provided on the bottom of the plate 1. The leads 3a and 3b are so positioned on the plate 1 as to contact the preselected ones of the supports 5 which play the role of electric terminals at the same time. When the plate 1 is mounted to the supports 5, the leads 3a and 3b are electrically connected to the power source circuit, not shown, via the above preselected supports 5.

A procedure for assembling the above piezoelectric vibrator will be described with reference to FIGS. 3–5. First, the conductive adhesive 11 is applied to the portions of the supports 5 which will contact the plate 1. Because the lower portions 6a of the supports 5 each have a U-shaped section, the adhesive 1 is prevented from flowing out of the supports 5.

As shown in FIG. 3, the lower portion 6a of each support 5 is longer than the upper portion 6b. Hence, the plate 1 can be easily inserted into the recesses 7 of the supports 5. Specifically, assume that the vibrator is assembled by an automatic machine. Then, the machine lowers the plate 1 toward the supports 5 while preventing it from contacting the upper portions 6b. After the plate 1 has rested on the lower portions 6a of the supports 5, the machine inserts the plate 1 into the recesses 7 of the supports 5. In this manner, the machine can position the plate 1 on the supports 5 with ease. This promotes the efficient assembly of the vibrator.

Figure 4:
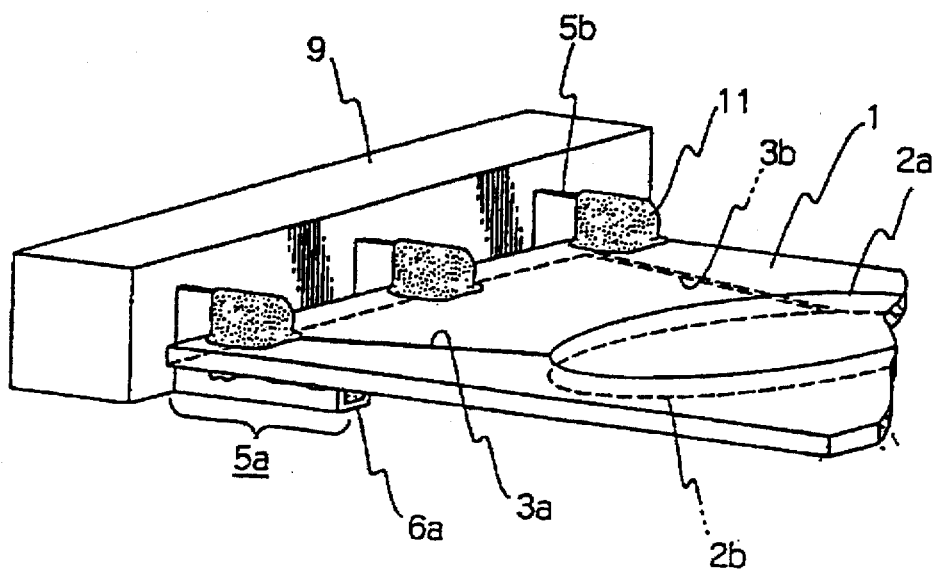
FIG. 4 is a perspective view showing a piezoelectric plate fixed to the supports of FIG. 1.

As shown in FIG. 4, the edge portion of the plate 1 received in the recesses 7 of the supports 5 is fixed in place by the adhesive 11. The plate 1 can be surely fixed to the supports 5 because a sufficient amount of adhesive 11 has been applied to the supports 5, as stated earlier. In this condition, the lead 3a provided on the top of the plate 1 and connected to the electrode 2a contacts one of the supports 5 that plays the role of an electric terminal (labeled 5a in FIG. 4). Likewise, the lead 3b provided on the bottom of the plate 1 contacts another support 5b that also plays the role of an electric terminal.

Figure 5:
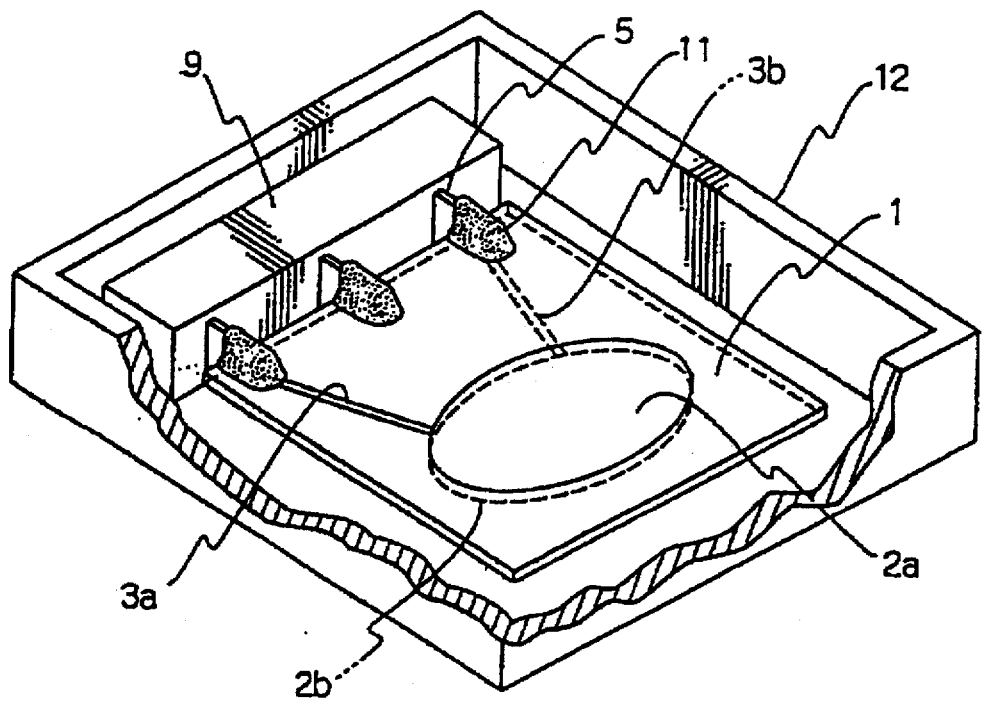
FIG. 5 is a perspective view showing the base supporting the plate and fixed to a surface mount type container.

As shown in FIG. 5, the base 9 carrying the plate 1 via the supports 5 is fixed to a surface mount type container 12 and then sealed therein. Thereafter, the power source circuit, not shown, is connected to the supports 5.

Figure 6:
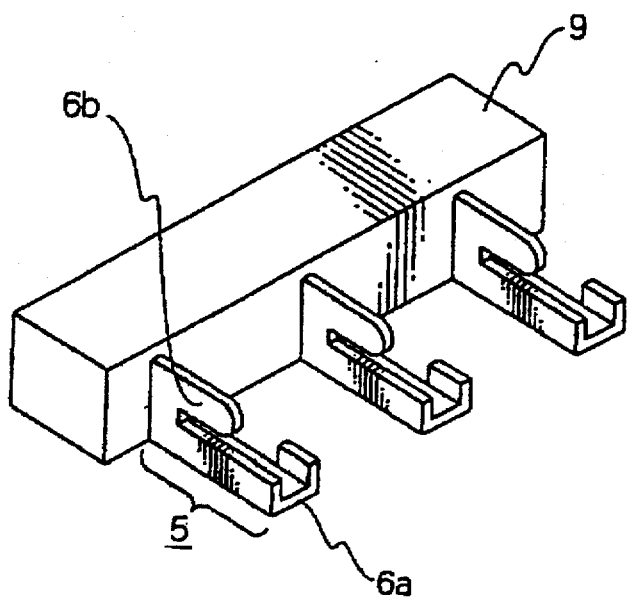
FIG. 6 is a perspective view showing an alternative embodiment of the present invention.

FIG. 6 shows an alternative embodiment of the present invention. As shown, this embodiment is different from the previous embodiment in that the lower portion 6a of each support 5 and for sustaining the plate 1 has a U-shaped section only in the end portion thereof remote from the base 9.

While the present invention has been described in connection with certain, preferred embodiments, it is to be understood that the subject matter encompassed by the present invention is not limited to those specific embodiments. On the contrary, it is intended for the subject matter of the present invention to include all alternatives, modifications, and equivalents as can be included within the spirit and scope of the following claims.

What is claimed is:

1. A piezoelectric vibrator comprising:

a piezoelectric plate comprising electrodes respectively provided on a top and a bottom, and leads each extending from the respective electrode;

a plurality of supports for fixing an edge portion of said piezoelectric plate including said leads by a conductive adhesive; and a base formed of an insulator, and supporting said plurality of supports, said plurality of supports each including a lower portion for sustaining said piezoelectric plate and provided with a U-shaped section, wherein said lower portion is longer than an upper portion included in each of said plurality of supports, said upper portion for supporting the top of said piezoelectric plate.

* * * * *